United States Patent
Ikeda

(10) Patent No.: US 11,776,937 B2
(45) Date of Patent: Oct. 3, 2023

(54) ELECTRONIC MODULE

(71) Applicant: SHINDENGEN ELECTRIC MANUFACTURING CO., LTD., Tokyo (JP)

(72) Inventor: Kosuke Ikeda, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 22 days.

(21) Appl. No.: 17/253,076

(22) PCT Filed: Jul. 4, 2018

(86) PCT No.: PCT/JP2018/025308
§ 371 (c)(1),
(2) Date: Dec. 16, 2020

(87) PCT Pub. No.: WO2020/008545
PCT Pub. Date: Jan. 9, 2020

(65) Prior Publication Data
US 2021/0134763 A1    May 6, 2021

(51) Int. Cl.
*H01L 23/00* (2006.01)
*H01L 25/07* (2006.01)
*H01L 23/16* (2006.01)
*H01L 23/31* (2006.01)

(52) U.S. Cl.
CPC ............ *H01L 25/074* (2013.01); *H01L 23/16* (2013.01); *H01L 23/3107* (2013.01); *H01L 24/73* (2013.01); *H01L 2224/73263* (2013.01)

(58) Field of Classification Search
CPC ......... H01L 24/37; H01L 24/84; H01L 24/32; H01L 24/29; H01L 24/83
See application file for complete search history.

(56) References Cited

U.S. PATENT DOCUMENTS

| | | | |
|---|---|---|---|
| 2002/0006685 A1 | 1/2002 | Petitbon et al. | |
| 2002/0149103 A1* | 10/2002 | Yang | ............ H01L 23/4951 257/723 |
| 2005/0161785 A1 | 7/2005 | Kawashima et al. | |

(Continued)

FOREIGN PATENT DOCUMENTS

| | | |
|---|---|---|
| JP | 2002093977 A | 3/2002 |
| JP | 2005217072 A | 8/2005 |

(Continued)

OTHER PUBLICATIONS

International Search Report in the international application No. PCT/JP2018/025308, dated Sep. 11, 2018.

(Continued)

*Primary Examiner* — Michele Fan
(74) *Attorney, Agent, or Firm* — Ladas & Parry, LLP

(57) ABSTRACT

An electronic module has a first substrate 11; a first electronic element 13 provided on one side of the first substrate 11; a first connection body 60 provided on the one side of the first electronic element 13; a second electronic element 23 provided on the one side of the first connection body 60; and a second connection body 70 provided on the one side of the second electronic element 23. The first electronic element 13 and the second electronic element 23 do not overlap in a plane direction.

6 Claims, 13 Drawing Sheets

(56) References Cited

U.S. PATENT DOCUMENTS

| | | | |
|---|---|---|---|
| 2009/0189259 A1 | 7/2009 | Mohamed et al. | |
| 2013/0001757 A1* | 1/2013 | Chia | H01L 25/105 |
| | | | 257/676 |
| 2016/0254250 A1 | 9/2016 | Ikeda et al. | |
| 2017/0025337 A1 | 1/2017 | Padmanabhan et al. | |
| 2017/0117213 A1 | 4/2017 | Cho et al. | |
| 2017/0311482 A1 | 10/2017 | Ikeda et al. | |

FOREIGN PATENT DOCUMENTS

| | | |
|---|---|---|
| JP | 2011142172 A | 7/2011 |
| JP | 2012248658 A | 12/2012 |
| KR | 20170014635 A | 2/2017 |
| WO | 2016059702 A1 | 4/2016 |
| WO | 2016067383 A1 | 5/2016 |
| WO | 2018047485 A1 | 3/2018 |

OTHER PUBLICATIONS

Written Opinion of the International Searching Authority in the international application No. PCT/JP2018/025308, dated Jul. 4, 2018 and English translation provided by Google Translate.
Partial supplementary European search report from European Patent Application No. 18925620.9 dated Jul. 1, 2022.

* cited by examiner

ELECTRONIC MODULE

CROSS-REFERENCE TO RELATED APPLICATION

The present application is the U.S. national phase of PCT Application No. PCT/JP2018/025308 filed on Jul. 4, 2018, the disclosure of which is incorporated herein by reference in its entirety.

TECHNICAL FIELD

The present invention relates to an electronic module having a connection body.

BACKGROUND ART

There has been known an electronic module in which a plurality of electronic elements is provided in a sealing resin. Such an electronic module is desired to be miniaturized. As a way of miniaturizing, it is conceivable to adopt an aspect in which electronic elements are stacked in layers. As such an aspect, WO 2016/067383 A is known.

However, WO 2016/067383 A only proposes that a semiconductor element included in an electronic element is provided on two opposing substrates. In addition, because providing two substrates would require an extra manufacturing cost or increase a size in a plane direction, some customers want only one substrate to be provided if possible. On the other hand, other customers want two substrates to be provided, considering a heat dissipation effect.

SUMMARY OF INVENTION

Technical Problem

The present invention provides an electronic module that can obtain a high heat dissipation effect and can be practically used even if only one substrate is provided.

Solution to Problem

[Concept 1]
An electronic module according to the present invention may comprise:
a first substrate;
a first electronic element provided on one side of the first substrate;
a first connection body provided on the one side of the first electronic element;
a second electronic element provided on the one side of the first connection body; and
a second connection body provided on the one side of the second electronic element, wherein
the first electronic element and the second electronic element may not overlap in a concept plane direction.

[Concept 2]
In the electronic module according to concept 1,
a surface on the one side of the first electronic element may be located in a one side position than a surface on another side of the first connection body which is located on the other side of the second electronic element.

[Concept 3]
In the electronic module according to concept 1 or 2,
the first connection body may have a first head area on another side of which the first electronic element is provided, a second head area on the one side of which the second electronic element is provided, and a bent part provided between the first head area and the second head area in the plane direction.

[Concept 4]
In the electronic module according to any one of concepts 1 to 3,
the first connection body may have a first head part and a plurality of first pillar parts extending from the first head part to another side,
the second connection body may have a second head part and a second pillar part extending from the second head part to the other side, and
the second electronic element, one of the first pillar parts and the second pillar part may overlap in the plane direction, and at least another one of the first pillar parts and the second pillar part may not overlap in the plane direction.

[Concept 5]
The electronic module according to any one of concepts 1 to 4 may further comprise a sealing part sealing the first electronic element, the first connection body, the second electronic element, and the second connection body, wherein
only the first connection body and the sealing part may be provided on the one side of the first electronic element.

[Concept 6]
The electronic module according to any one of concepts 1 to 4 may further comprise:
a sealing part sealing the first electronic element, the first connection body, the second electronic element and the second connection body; and
a second substrate provided on the one side of the second connection body, wherein
only the first connection body and the sealing part, or only the first connection body, the sealing part and a second conductor layer provided on another side of the second substrate may be provided between the second substrate and the first electronic element in a thickness direction.

[Concept 7]
The electronic module according to any one of concepts 1 to 4 may further comprise a second substrate provided on the one side of the second connection body, wherein
a spacer may be provided between the second substrate and the first connection body.

[Concept 8]
In the electronic module according to any one of concepts 1 to 7,
the first connection body may have a first head part and a plurality of first support parts extending from the first head part,
at least one of the first support parts functions electrically, and at least one of the first support parts may not function electrically.

[Concept 9]
In the electronic module according to any one of concepts 1 to 8,
the second connection body may have a second head part and a plurality of second support parts extending from the second head part,
at least one of the second support parts functions electrically, and at least one of the second support parts may not function electrically.

[Concept 10]
In the electronic module according to any one of concepts 1 to 9,
the first connection body may have a first head part and a plurality of first support parts extending from the first head part, the second connection body may have a second head part and a plurality of second support parts extending from the second head part, and an angle between a direction in which the first support part extends from the first head part in the plane direction and a direction in which the second support part extends from the second head part in the plane direction may be within a range from 0 degrees to ±45 degrees.

Advantageous Effects of Invention

In one aspect of the present invention, when an aspect is adopted in which a first electronic element and a second electronic element do not overlap in the plane direction, a high heat dissipation effect can be obtained. Further, adopting this aspect makes it possible to practically use the electronic module even if only one substrate is provided, and to appropriately select between an aspect in which one substrate is provided and an aspect in which two substrates are provided.

BRIEF DESCRIPTION OF DRAWINGS

FIG. 10(*b*) is a side view showing an aspect in which a second substrate in FIG. 10(*a*) is not provided.

FIG. 11(*b*) is a side view showing an aspect in which a second substrate and a spacer in FIG. 11(*a*) are not provided.

DESCRIPTION OF EMBODIMENTS

First Embodiment

<<Configuration>>

Figure 1:
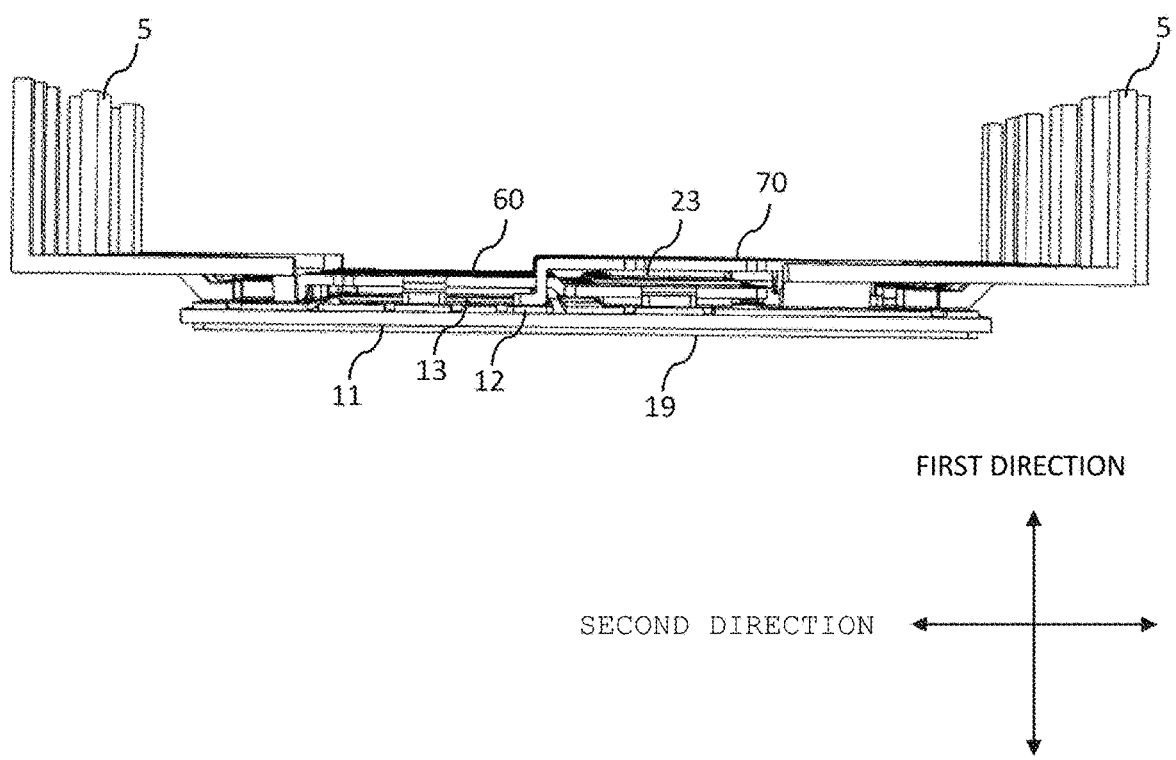
FIG. 1 is a side view of a configuration inside a sealing part of an electronic module that can be used in a first embodiment of the present invention.

In the present embodiment, "one side" means an upper side in FIG. 1, and "other side" means a lower side in FIG. 1. A vertical direction in FIG. 1 is called a "first direction", a lateral direction is called a "second direction", and a front-rear direction of the sheet is called a "third direction". A direction including the second direction and the third direction is referred to as "plane direction".

As shown in FIG. 1, an electronic module according to the present embodiment may have a first substrate 11, a first electronic element 13 provided on one side of the first substrate 11, a first connection body 60 provided on one side of the first electronic element 13, a second electronic element 23 provided on one side of the first connection body 60, and a second connection body 70 provided on one side of the second electronic element 23. The first electronic element 13 and the second electronic element 23 do not have to overlap in the plane direction. However, the present invention is not limited to this aspect, and the first electronic element 13 and the second electronic element 23 may overlap in the plane direction. Part or all of the first electronic element 13 may overlap the second electronic element 23 in the plane direction. Part or all of the second electronic element 23 may overlap the first electronic element 13 in the plane direction. Further, the second connection body 70 do not have to be provided.

A first conductor layer 12 including a metal such as copper may be provided on the one side of the first substrate 11. The first electronic element 13 may be provided on the first conductor layer 12 via a conductive adhesive such as solder.

Between the first electronic element 13 and the first connection body 60, between the first connection body 60 and the second electronic element 23, and between the second electronic element 23 and the second connection body 70, a conductive adhesive (not shown) such as solder may be provided.

Figure 3:
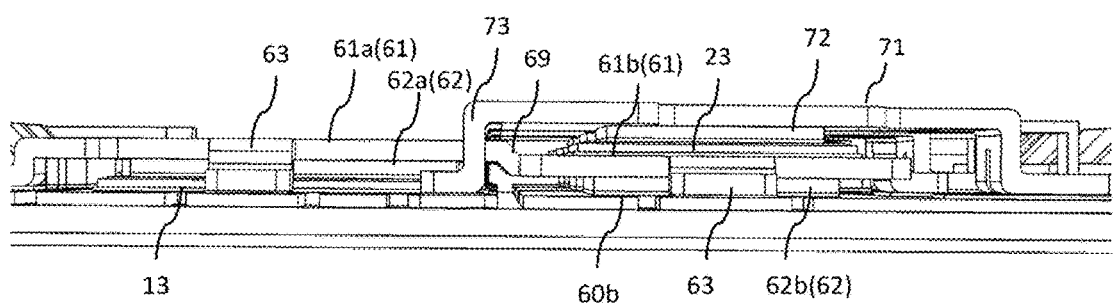
FIG. 3 is an enlarged side view of the configuration inside the sealing part of the electronic module that can be used in the first embodiment of the present invention.

As shown in FIG. 3, a surface (upper surface in FIG. 3) on one side of the first electronic element 13 may be located in the one side position than a surface (lower surface in FIG. 3) 60*b* on the other side of the first connection body 60 located on the other side of the second electronic element 23. In an aspect shown in FIG. 3, the surface 60*b* on the other side of the first connection body 60 is a surface on the other side of a first pillar part 62*b* described later. However, the present invention is not limited to this aspect, and the surface on the one side of the first electronic element 13 may be located in the other side position (lower side) than the surface 60*b* on the other side of the first connection body 60 located on the other side of the second electronic element 23.

Figure 4:
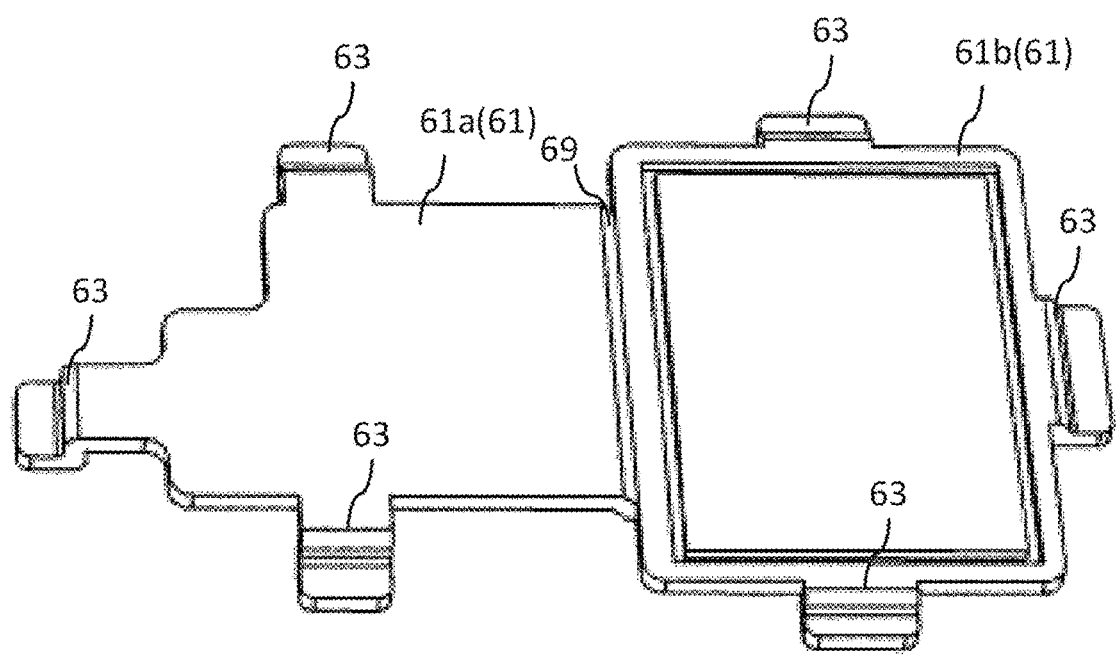
FIG. 4 is a perspective view of a first connection body that can be used in the first embodiment of the present invention.
Figure 5:
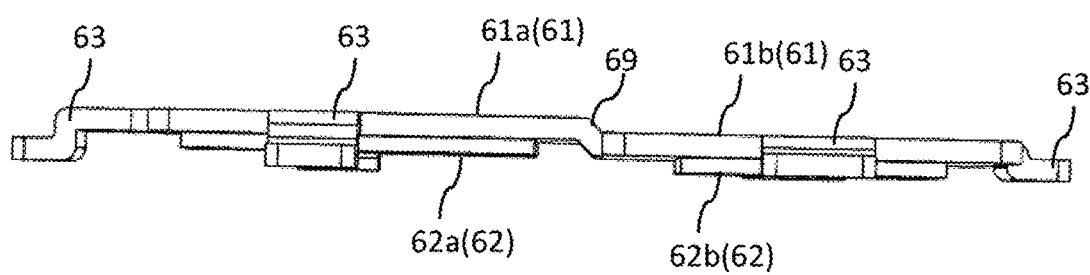
FIG. 5 is a side view of the first connection body that can be used in the first embodiment of the present invention.

The first connection body 60 may have a bent part 69, and the first electronic element 13 and the second electronic element 23 may be provided, with the bent part 69 interposed therebetween in the plane direction. More specifically, as shown in FIGS. 4 and 5, an aspect may be adopted in which the first connection body 60 has a first head area 61*a* on the other side of which the first electronic element 13 is provided, a second head area 61*b* on one side of which the second electronic element 23 is provided, and the bent part 69 provided between the first head area 61*a* and the second head area 61*b* in the plane direction.

Figure 8:
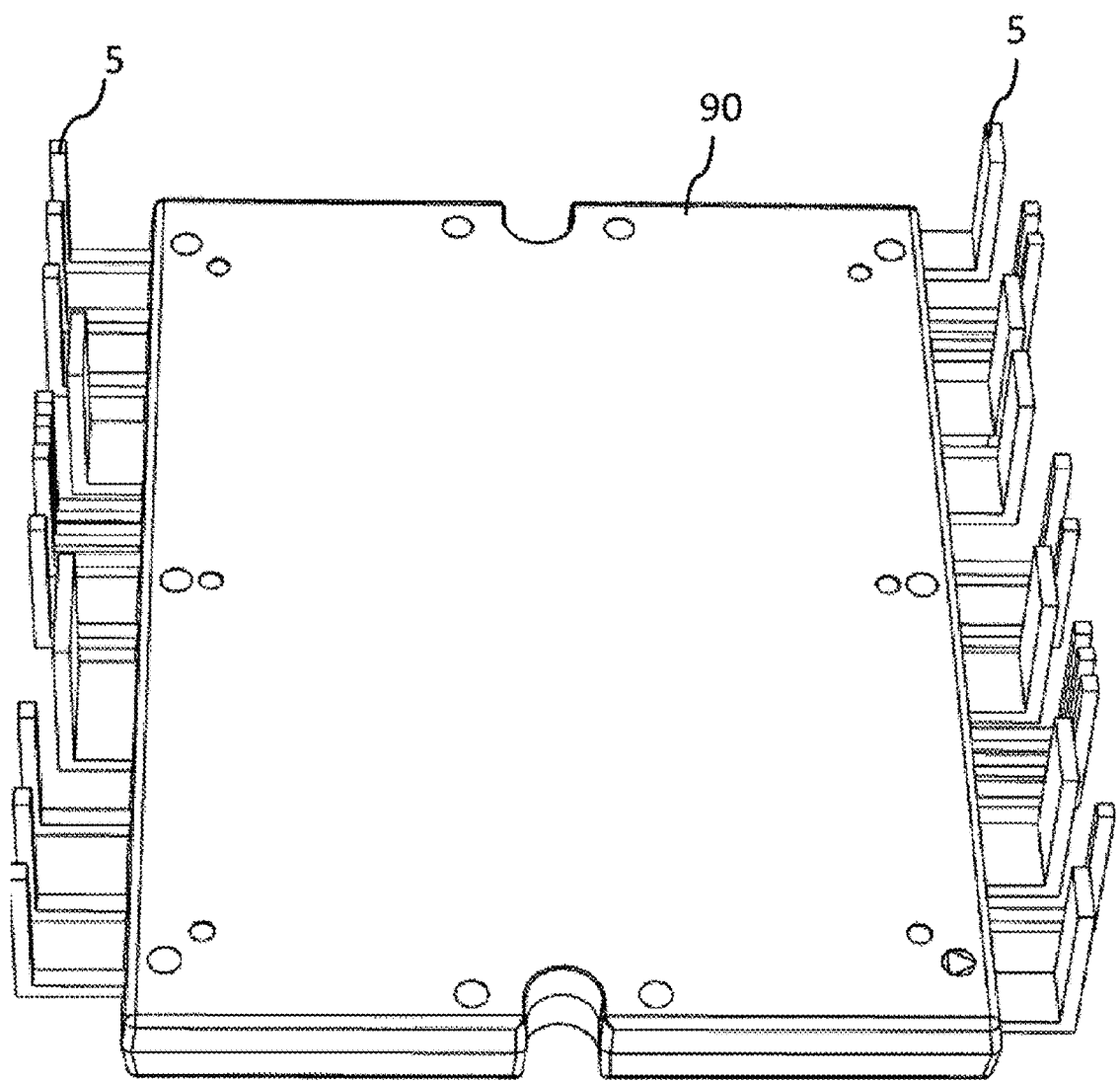
FIG. 8 is a perspective view of an appearance of the electronic module that can be used in the first embodiment of the present invention.

As shown in FIG. 8, a sealing part 90 including a sealing resin or the like that seals the first electronic element 13, the first connection body 60, the second electronic element 23, and the second connection body 70 may be provided.

In the electronic module, an aspect may be adopted where only the sealing part 90 is provided and the other members are not provided on one side of the second connection body 70 and one side of an area of the first connection body 60 where the first electronic element 13 is provided (one side of a part of the first head area 61a) (see FIG. 3).

The first electronic element 13 may be a switching element or a control element. When the first electronic element 13 is a switching element, the first electronic element 13 may be a MOSFET, an IGBT, or the like. The second electronic element 23 may be a switching element or a control element. When the second electronic element 23 is a switching element, the second electronic element 23 may be a MOSFET, an IGBT, or the like. Each of the first electronic element 13 and the second electronic element 23 may be configured by a semiconductor element, and the semiconductor material may be silicon, silicon carbide, gallium nitride, or the like. The surface on the other side of the first electronic element 13 may be connected to the first conductor layer 12 via a conductive adhesive such as solder.

As shown in FIGS. 3 to 5, the first connection body 60 may have a first head part 61 and a first pillar part 62 extending from the first head part 61 to the other side. The first connection body 60 may have a first head area 61a and a first pillar part 62a located on the one side of the first electronic element 13, and the first head area 61b and the first pillar part 62b located on the other side of the second electronic element 23. The first connection body 60 may have a substantially T-shaped section.

As shown in FIG. 3, the first electronic element 13 may be provided on the other side of the first head area 61a, and the second electronic element 23 may be provided on the one side of the second head area 61b.

Figure 6:
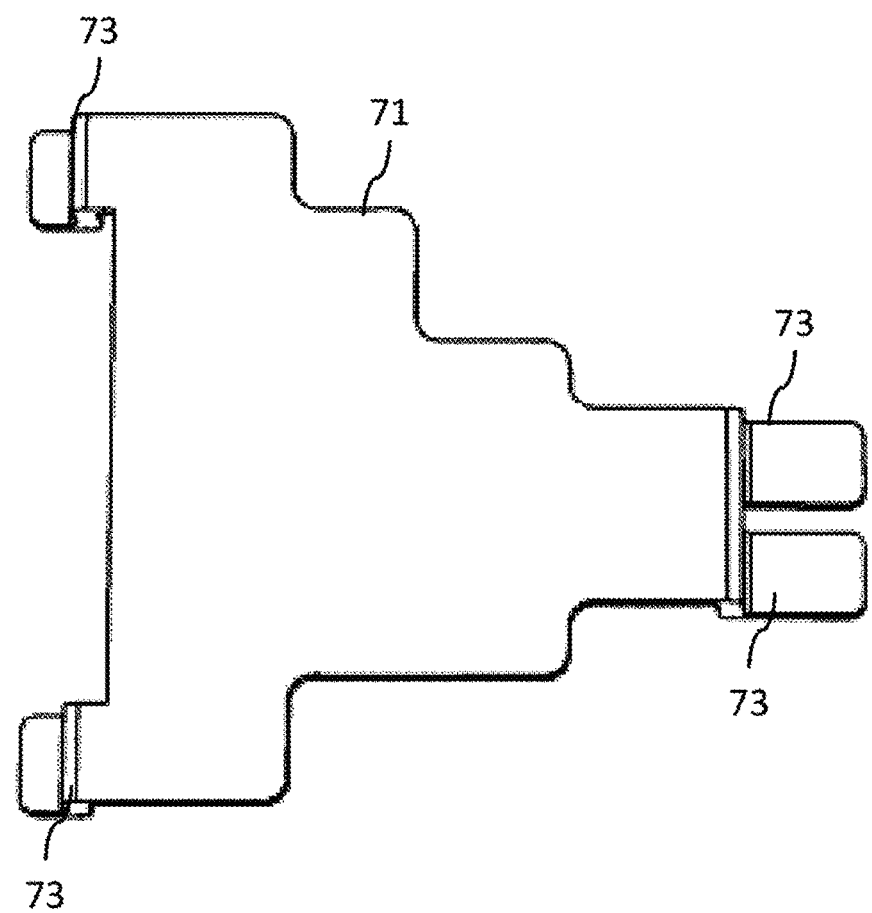
FIG. 6 is a plan view of a second connection body that can be used in the first embodiment of the present invention.
Figure 7:
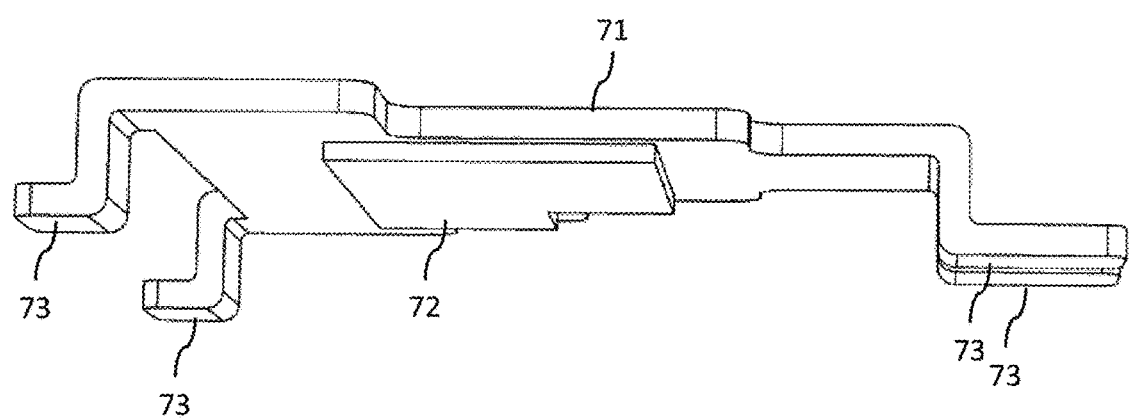
FIG. 7 is a perspective view of the second connection body that can be used in the first embodiment of the present invention, as viewed from the other side (reverse surface).

As shown in FIGS. 6 and 7, the second connection body 70 may have a second head part 71 and a second pillar part 72 extending from the second head part 71 to the other side. The second connection body 70 may also have a substantially T-shaped section.

Similarly to the first pillar part 62 and the first pillar part 62b described above, the first connection body 60 may have a plurality of first pillar parts 62 (62a and 62b). One of the first pillar parts 62 and the second pillar part 72 may overlap in the plane direction, and at least one of the other first pillar parts 62 and the second pillar part 72 do not have to overlap in the plane direction. In the aspect shown in FIG. 3, the first pillar part 62b and the second pillar part 72 overlap in the plane direction, and the first pillar part 62a and the second pillar part 72 do not overlap in the plane direction.

As shown in FIG. 4, the first connection body 60 may have one or a plurality of first support parts 63 extending from the first head part 61. When the plurality of first support parts 63 is provided, an aspect may be adopted in which at least one of the first support parts 63 functions electrically, and at least one of the first support parts 63 does not function electrically. In an aspect shown in FIG. 4, an aspect may be adopted in which only one first support part 63 functions electrically, and the other five first support parts 63 do not function electrically.

As shown in FIG. 6, the second connection body 70 may have one or a plurality of second support parts 73 extending from the second head part 71. When the plurality of second support parts 73 is provided, an aspect may be adopted in which at least one of the second support parts 73 electrically functions, and at least one of the second support parts 73 does not function electrically. In an aspect shown in FIG. 6, an aspect may be adopted in which only one second support part 73 functions electrically, and the other three second support parts 73 do not function electrically.

Figure 2:
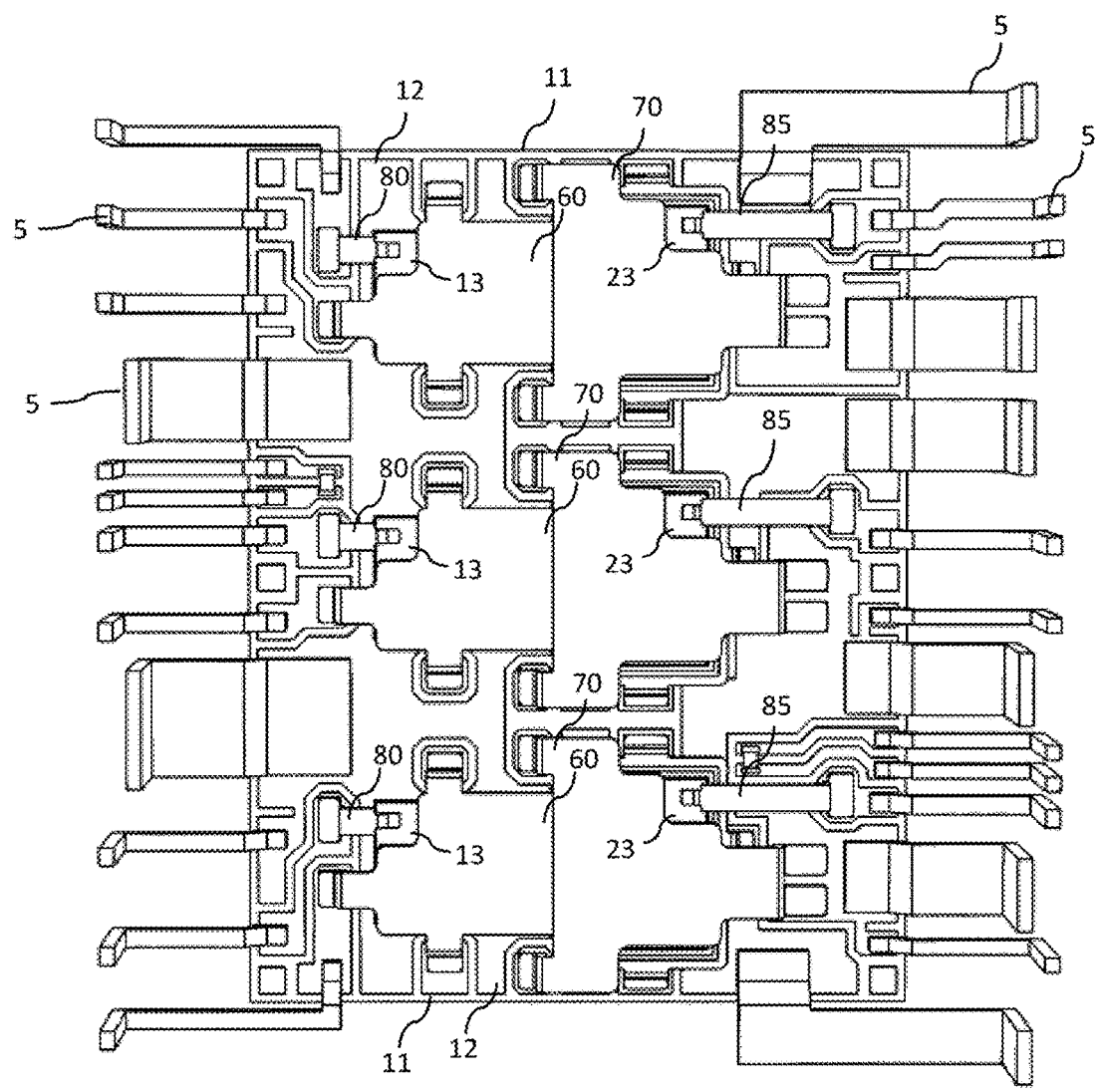
FIG. 2 is a plan view of the electronic module that can be used in the first embodiment of the present invention.
Figure 2:
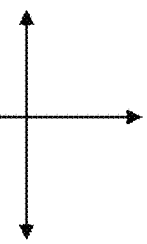

As shown in FIG. 2, a third connection body 80 may be provided on the one side of the first electronic element 13. A fourth connection body 85 may be provided on the one side of the second electronic element 23. As the third connection body 80 and the fourth connection body 85, general connectors may be used.

Figure 9:
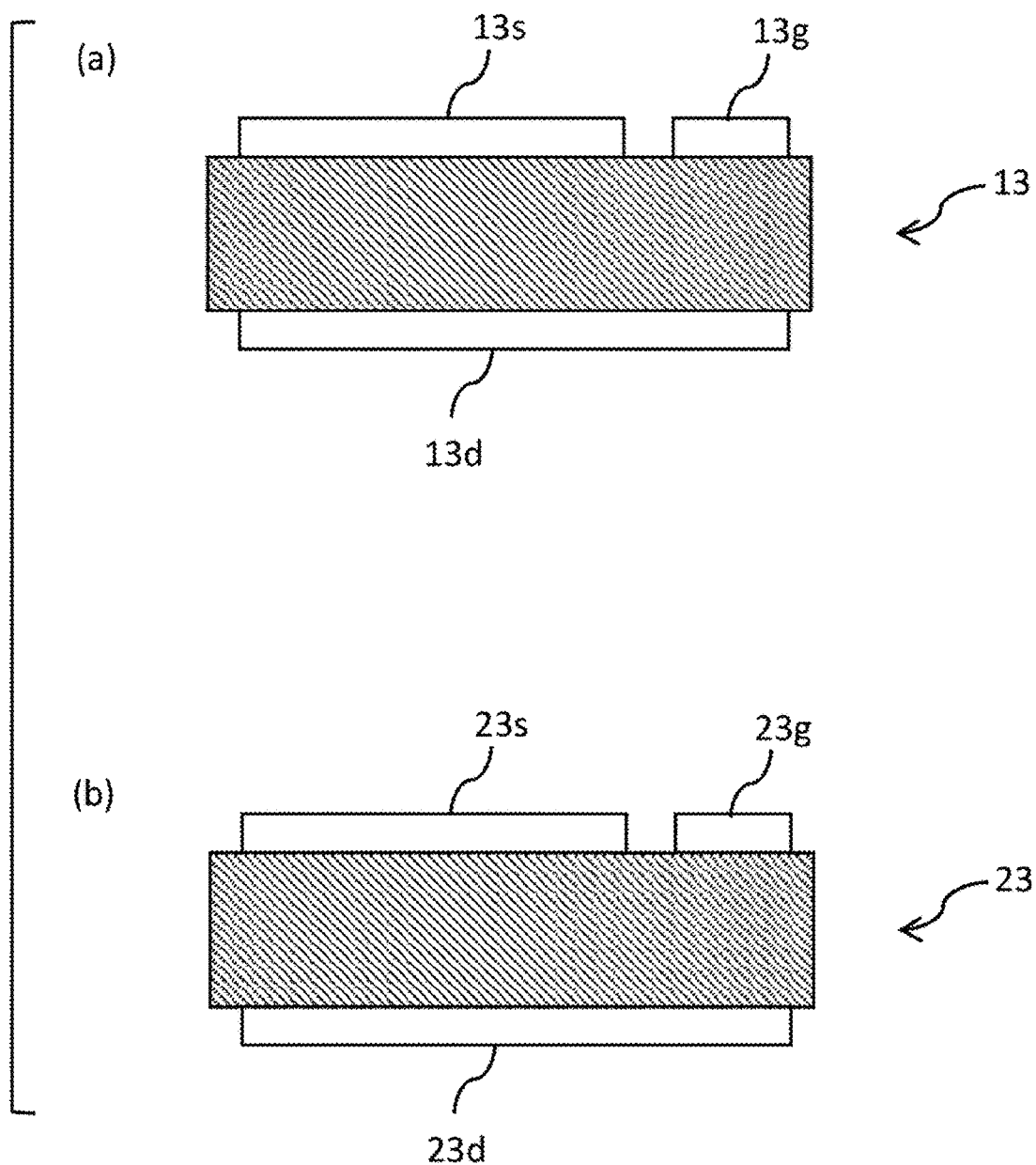
FIG. 9 is a side view of a first electronic element and a second electronic element that can be used in the first embodiment of the present invention.

As shown in FIG. 9(a), the first electronic element 13 may have a first electrode of first element (for example, first source electrode) 13s and a second electrode of first element (for example, first gate electrode) 13g on the surface on the one side. As shown in FIG. 9(b), the second electronic element 23 may have a first electrode of second element (for example, a second source electrode) 23s and a second electrode of second element (for example, second gate electrode) 23g on the surface on the one side. In this case, for example, the second pillar part 72 of the second connection body 70 may be connected to the first electrode 23s of second element of the second electronic element 23 via a conductive adhesive, and the fourth connection body 85 may be connected to the second electrode 23g of second element of the second electronic element 23 via a conductive adhesive. Further, the first connection body 60 may connect the first electrode 13s of first element of the first electronic element 13 and a third electrode of second element (for example, second drain electrode) 23d provided on the other side of the second electronic element 23 via a conductive adhesive. The first pillar part 62 of the first connection body 60 may be in contact with the first electrode 13s of first element of the first electronic element 13 located on the other side via a conductive adhesive. The second head area 61b of the first connection body 60 may be in contact with the third electrode 23d of second element located on the one side via a conductive adhesive. The second electrode 13g of first element of the first electronic element 13 may be connected to the third connection body 80 including a connector or the like via a conductive adhesive. The third connection body 80 may be connected to the first conductor layer 12 via a conductive adhesive.

Unlike such an aspect, the first electronic element 13 may have the first electrode 13s of first element and the second electrode 13g of first element on the surface on the other side, and the third electrode 13d of first element on the surface on the one side. Further, the second electronic element 23 may have the first electrode 23s of second element and the second electrode 23g of second element on the surface on the other side, and a third electrode 23d of second element on the surface on the one side. In this case, the second connection body 70 may be connected to the third electrode 23d of second element. Further, the first connection body 60 may electrically connect the third electrode 13d of first element provided on the one side of the first electronic element 13 and the first electrode 23s of second element provided on the other side of the second electronic element 23.

As shown in FIG. 2, the first conductor layer 12 may be connected to a terminal part 5, and a distal end of the terminal part 5 may be exposed to the outside of the sealing part 90 to be connectable to an external device.

A ceramic substrate, an insulating resin layer, or the like can be used as the first substrate 11. As the conductive adhesive, a material including Ag or Cu as a main component may be used in addition to solder. As a material of the first connection body 60 and the second connection body 70, a metal such as Cu can be used. Note that, as the first substrate 11, for example, a metal substrate subjected to circuit patterning can be used. In this case, the first substrate 11 also serves as the first conductor layer 12.

The terminal part 5 and the first conductor layer 12 may be joined not only by using a conductive adhesive such as solder, but also by laser welding or ultrasonic joining.

As shown in FIG. 1, a first heat dissipation plate 19 including copper or the like may be provided on a surface on the other side of the first substrate 11. The first heat dissipation plate 19 may be in contact with a cooling body such as a heat sink.

Effects

Next, effects of the present embodiment having the above configuration will be described. Note that any aspect described in "Effects" can be adopted in the above configuration.

In the present embodiment, as shown in FIG. 1, when the aspect is adopted in which the first electronic element 13 and the second electronic element 23 do not overlap in the plane direction, a certain degree of heat dissipation can be maintained. Thus, a high heat dissipation effect can be also obtained in an aspect in which a second substrate 21 is not provided, which will be described later. A manufacturer can therefore easily select between an aspect in which the second substrate 21 is provided and an aspect in which the second substrate 21 is not provided, as shown in other embodiments described later. As a result, both the aspect in which the second substrate 21 is provided and the aspect in which the second substrate 21 is not provided can be adopted in response to a customer's request. In the aspect in which the second substrate 21 is provided, an electronic unit as shown in FIG. 1 is adopted. This can increase a production efficiency and suppress a manufacturing cost.

By adopting an aspect in which the first electronic element 13 and the second electronic element 23 do not overlap in the plane direction, an area on the side where the second electronic element 23 is provided (second head area 61b) can be located in the other side position than an area on the side where the first electronic element 13 is provided (first head area 61a) using the bent part 69. Adopting this aspect can reduce a size (thickness) in a thickness direction (first direction).

As shown on a right side in FIG. 3, when an aspect is adopted in which the second electronic element 23, one first pillar part 62b, and the second pillar part 72 overlap in the plane direction, heat from the second electronic element 23 can be released directly toward the first substrate 11 via the first pillar part 62b, and heat from the second electronic element 23 can be released via the second pillar part 72, the second head part 71, and the second support part 73.

As shown on a left side in FIG. 3, in the electronic module, when an aspect is adopted in which only the sealing part 90 is provided on the one side of the second connection body 70, only the first connection body 60 and the sealing part 90 are provided on the one side of the first electronic element 13, and the other members are not provided on these sides, it can be expected that the number of parts is reduced and the size in the thickness direction is reduced as compared with other embodiments described later.

As shown in FIG. 4, when an aspect is adopted in which the first connection body 60 has the plurality of first support parts 63 extending from the first head part 61, heat can be released toward the first substrate 11 via the first support parts 63. Further, by adopting an aspect in which at least one of the first support parts 63 electrically functions and at least one of the first support parts 63 does not electrically function, a part of the first support parts 63 is used in an electrical aspect and the other first support parts 63 can be used for heat dissipation.

As shown in FIG. 6, when an aspect is adopted in which the second connection body 70 has the plurality of second support parts 73 extending from the second head part 71, heat can be released toward the second substrate 21 via the second support parts 73. Further, by adopting an aspect in which at least one of the second support parts 73 electrically functions and at least one of the second support parts 73 does not electrically function, a part of the second support parts 73 is used in an electrical aspect and the other second support parts 73 can be used for heat dissipation.

Second Embodiment

Next, a second embodiment of the present invention will be described.

Figure 10:
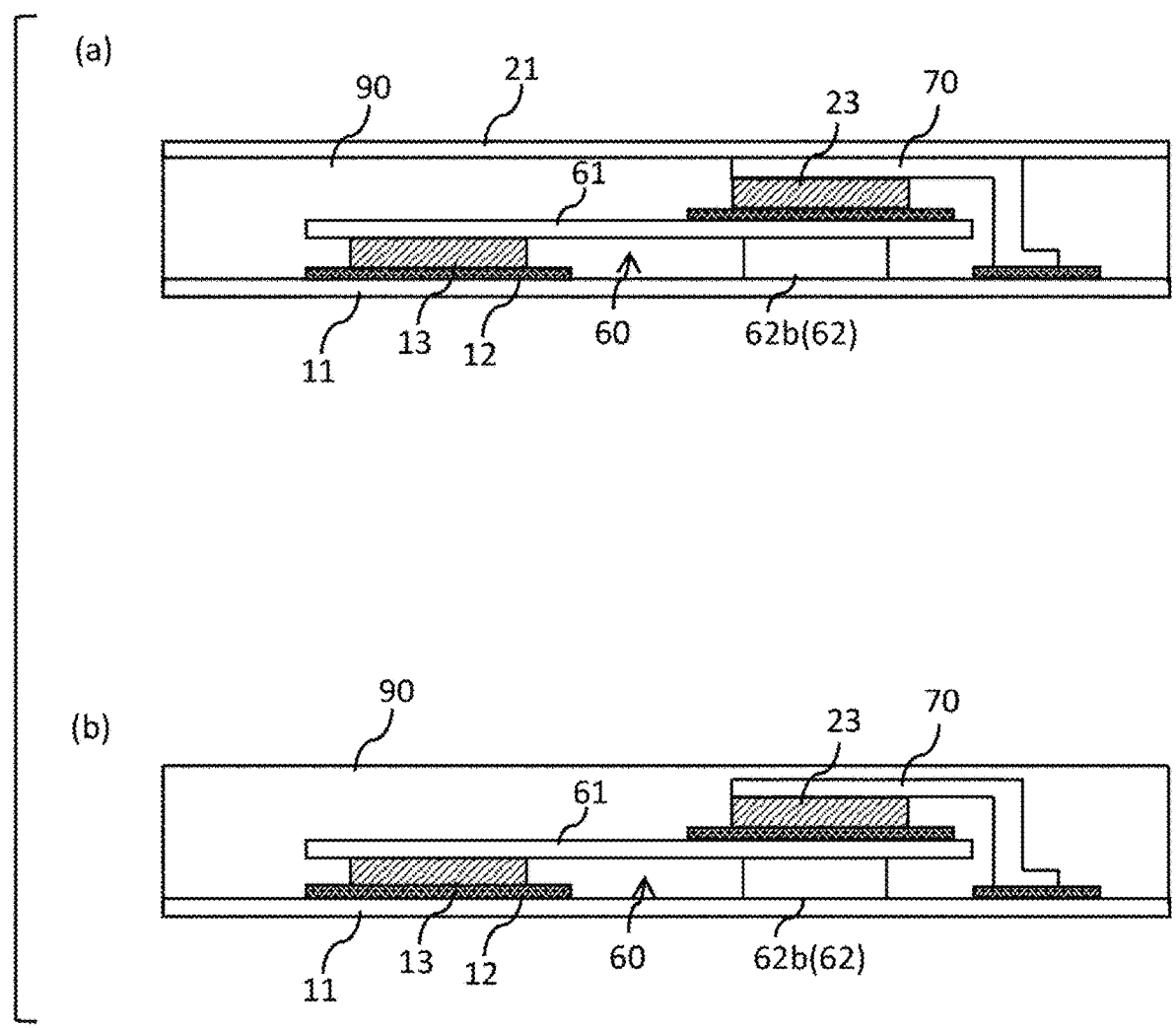
FIG. 10(*a*) is a side view of an electronic module that can be used in a second embodiment of the present invention.

In the present embodiment, as shown in FIG. 10(a), the second substrate 21 is provided on the one side of the second connection body 70. In this aspect, the second substrate 21 or the second conductor layer 22 and the second connection body 70 are in contact with each other via a conductive adhesive or directly in contact with each other without any material therebetween. Only the first connection body 60 and the sealing part 90 are provided between the second substrate 21 and the first electronic element 13 in the thickness direction (that is, the first direction). Note that FIG. 10(b) shows an aspect in which the second substrate 21 is not provided in the aspect shown in FIG. 10(a). In the aspect shown in FIG. 10, the first pillar part 62a and the second pillar part 72 in the first embodiment are not provided, and the bent part 69 is not provided. Other configurations are similar to those of the first embodiment, and any aspect described in the first embodiment can be adopted. The same reference signs are used for the members described in the first embodiment.

The second substrate 21 may be provided as shown in FIG. 10(a). Whether to provide this second substrate 21 may be determined in response to the customer's request. Providing this second substrate 21 makes it possible to release the heat from the second electronic element 23 to the second substrate 21 via the second connection body 70, and to enhance the heat dissipation effect.

Further, as shown in FIG. 10(b), the aspect can be adopted in which the second substrate 21 is not provided. In this case, because the second substrate 21 is not provided, the manufacturing cost can be reduced and the size in the thickness direction (that is, first direction) can be reduced. In the aspect shown in FIG. 10(b), only the first connection body 60 and the sealing part 90 are provided on the one side of the first electronic element 13.

In the aspect shown in FIG. 10, because the first pillar part 62a and the second pillar part 72 are not provided, the size in the thickness direction can be reduced. However, in a viewpoint of releasing the heat from the first electronic element 13 and the second electronic element 23, it is more beneficial to provide the first pillar part 62a and the second pillar part 72 as in the first embodiment.

The second conductor layer 22 (see FIG. 12) may be provided on a surface on the other side of the second substrate 21. In this case, only the first connection body 60, the sealing part 90, and the second conductor layer 22 are provided between the second substrate 21 and the first electronic element 13 in the thickness direction (that is, the first direction).

The second conductor layer 22 and the second substrate 21 may be connected via a conductive adhesive such as solder. A ceramic substrate, an insulating resin layer, or the like can be used as the second substrate 21. As the second substrate 21, for example, a metal substrate subjected to circuit patterning can be used. In this case, the second substrate 21 also serves as the second conductor layer.

A surface on the one side of the second substrate 21 may be in contact with a cooling body such as a heat sink to promote heat dissipation.

Third Embodiment

Next, a third embodiment of the present invention will be described.

Figure 11:
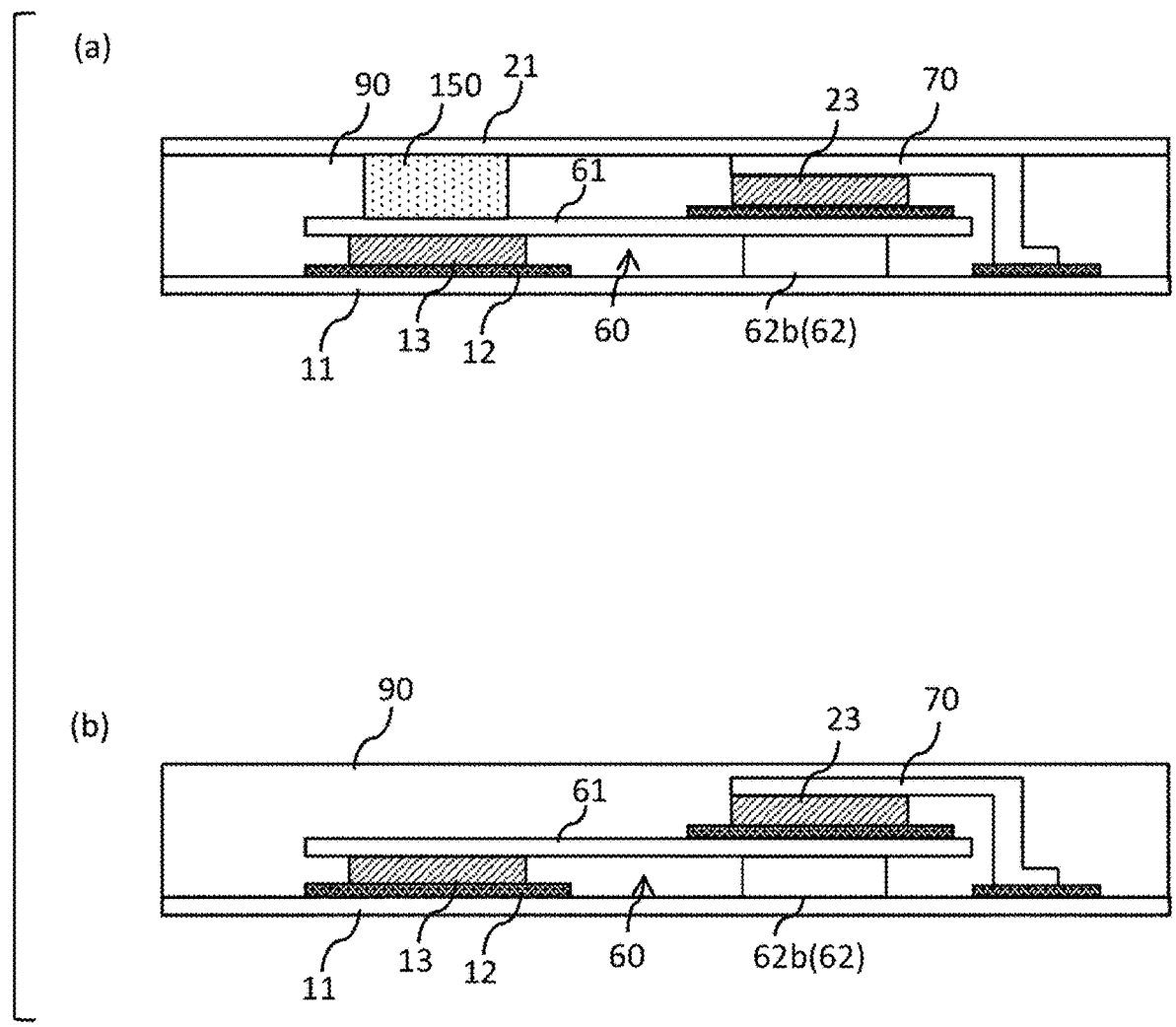
FIG. 11(*a*) is a side view of an electronic module that can be used in the third embodiment of the present invention.

In the present embodiment, as in the second embodiment, the second substrate 21 is provided on the one side of the second connection body 70. However, unlike the second embodiment, as shown in FIG. 11(a), between the second substrate 21 and the first connection body 60, a spacer 150 is provided which is in contact with a surface on the one side of the second substrate 21 or the second conductor layer 22 and a surface on the other side of the first connection body 60. For other configurations, all the aspects described in the above embodiments can be adopted. The members described in the above embodiments will be described using the same reference signs. Note that FIG. 11(b) shows an aspect in which the second substrate 21 and the spacer 150 are not provided in the aspect shown in FIG. 11(a).

The spacer 150 provided as in the present embodiment can effectively release the heat generated in the first electronic element 13 to the second substrate 21 via the spacer 150, and enhance the heat dissipation effect. As the spacer 150, metal such as copper may be used, or a heat-dissipating insulating member may be used. Further, providing this spacer 150 makes it possible to support the surface of the second substrate 21 on the other side, and reduce a possibility of deviation in the thickness direction of the second substrate 21 when the sealing part 90 is formed from the sealing resin.

Figure 12:
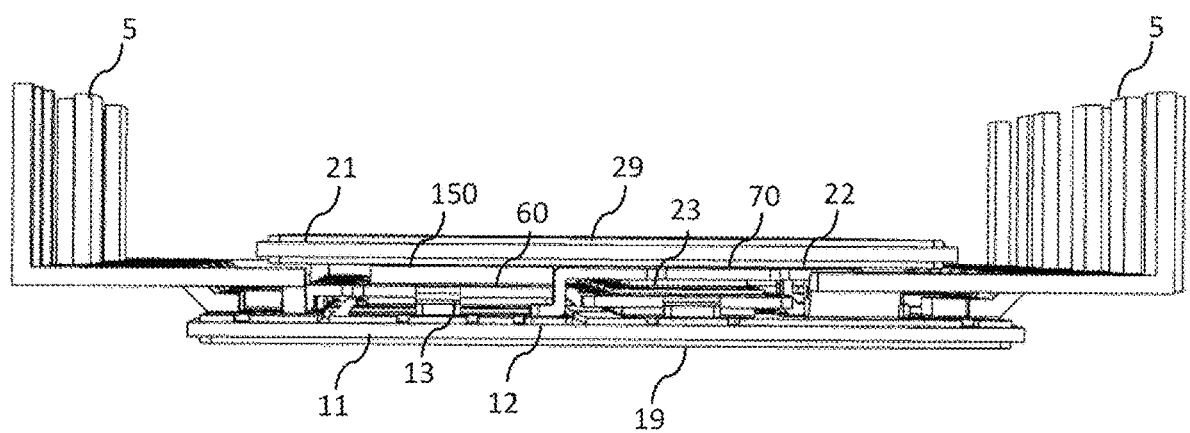
FIG. 12 is a side view showing an aspect in which a second substrate and a spacer are provided in an aspect shown in FIG. 1.

FIG. 12 shows an aspect in which the spacer 150 and the second substrate 21 are provided in the aspect shown in FIG. 1. As shown in FIG. 12, a second heat dissipation plate 29 may be provided on the one side of the second substrate 21. A size of the second substrate 21 in the plane direction may be smaller than a size of the first substrate 11 in the plane direction.

Fourth Embodiment

Next, a fourth embodiment of the present invention will be described.

Figure 13:
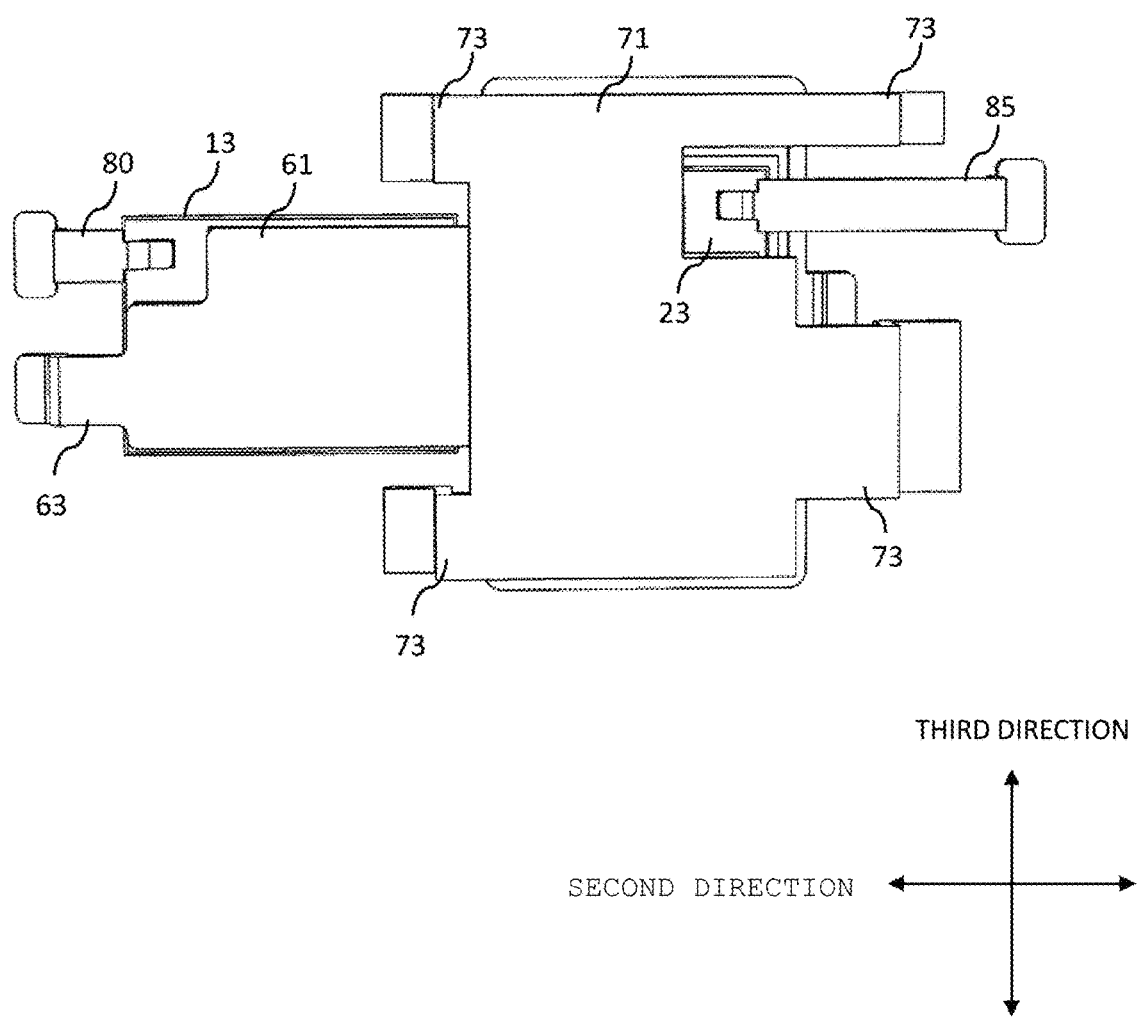
FIG. 13 is a plan view showing a relationship between a first connection body and a second connection body that can be used in a fourth embodiment of the present invention.

In the present embodiment, an angle between a direction in which the first support part 63 extends from the first head part 61 in the plane direction and a direction in which the second support part 73 extends from the second head part 71 in the plane direction is within a range from 0 degrees to ±45 degrees, inclusive. In an aspect shown in FIG. 13, with respect to all the first support parts 63 and all the second support parts 73, the direction in which the first support parts 63 extend from the first head part 61 in the plane direction and the direction in which the second support parts 73 extend from the second head part 71 in the plane direction are the same direction (second direction), and the angle between these directions is 0 degrees in the plane direction. The support parts 63 and 73 refer to parts that have a width smaller than that of the head parts 61 and 71 and protrude in the plane direction. In the aspect shown in FIG. 13, the support parts 63 and 73 refer to parts that have a width in the third direction smaller than that of the head parts 61 and 71 and protrude in the plane direction along the second direction. For other configurations, all the aspects described in the above embodiments can be adopted. The members described in the above embodiments will be described using the same reference signs.

The direction in which the first support part 63 extends from the first head part 61 in the plane direction and the direction in which the second support part 73 extends from the second head part 71 in the surface direction as in the present embodiment are within a range from 0 degrees to ±45 degrees, inclusive. Adopting such an aspect can reduce the size of the first connection body 61 and the second connection body 71 in the width direction (third direction in FIG. 13), and thus reduce the size of an electronic device in the width direction. From this viewpoint, it is beneficial that the direction in which the first support part 63 extends from the first head part 61 in the plane direction and the direction in which the second support part 73 extends from the second head part 71 in the plane direction make 0 degrees. Further, it is beneficial that, of all the first support parts 63 and all the second support parts 73, the direction in which the first support parts 63 from the first head part 61 extend in the plane direction and the direction in which the second support parts 73 from the second head part 71 in the plane direction make 0 degrees.

The description of the above embodiments and the disclosure of the drawings are merely examples for explaining the invention described in the claims, and the invention described in the claims is not limited by the description of the above embodiments or the disclosure of the drawings. Further, the description of the original claims is merely an example, and the description of the claims can be appropriately changed based on the description of the specification, drawings, and the like.

REFERENCE SIGNS LIST

11 First substrate
13 First electronic element
21 Second substrate
23 Second electronic element
60 First connection body
60b surface on other side of first connection body
61 First head part
61a First head area
61b Second head area
63 First support part
69 Bent part
70 Second connection body
71 Second head part
73 Second support part
90 Sealing part
150 Spacer

The invention claimed is:
1. An electronic module comprising:
a first substrate which is a ceramic substrate, an insulating resin layer or a metal substrate;
a first electronic element provided on upper side of the first substrate;
a first connection body provided on upper side of the first electronic element;
a second electronic element provided on upper side of the first connection body; and a second connection body provided on upper side of the second electronic element, wherein
the first electronic element and the second electronic element do not overlap in a plane direction,
the first connection body has a first head part including a first head area on lower side of the first connection body where the first electronic element is provided, a second head area on upper side of the first connection body where the second electronic element is provided, and a bent part provided between the first head area and the second head area in the plane direction, and
the first connection body has a plurality of first support parts extending from the first head part and abutting on the first substrate, or the second connection body has a second head part and a plurality of second support parts extending from the second head part and abutting on the first substrate,
the first connection body has a plurality of first pillar parts extending from the first head part to lower side,
the second connection body has a second head part and a second pillar part extending from the second head part to lower side, and
the second electronic element is sandwiched between one of the first pillar parts and the second pillar part, wherein the second electronic element, the one of the first pillar parts and the second pillar part overlap in the plane direction, and
at least another one of the first pillar parts and the second pillar part do not overlap in the plane direction.

2. The electronic module according to claim 1 further comprising:
a sealing part sealing the first electronic element, the first connection body, the second electronic element and the second connection body; and
a second substrate provided on the upper side of the second connection body, wherein
only the first connection body and the sealing part, or only the first connection body, the sealing part and a second conductor layer provided on lower side of the second substrate are provided between the second substrate and the first electronic element in a thickness direction.

3. The electronic module according to claim 1 further comprising a second substrate provided on the upper side of the second connection body, wherein
a spacer is provided between the second substrate and the first connection body.

4. The electronic module according to claim 1, wherein
the first connection body has a first head part and a plurality of first support parts extending from the first head part,
the second connection body has a second head part and a plurality of second support parts extending from the second head part, and
an angle between a direction in which the first support part extends from the first head part in the plane direction and a direction in which the second support part extends from the second head part in the plane direction is within a range from 0 degrees to ±45 degrees.

5. An electronic module comprising:
a first substrate which is a ceramic substrate, an insulating resin layer or a metal substrate;
a first electronic element provided on upper side of the first substrate;
a first connection body provided on upper side of the first electronic element;
a second electronic element provided on upper side of the first connection body; and
a second connection body provided on upper side of the second electronic element, wherein
the first electronic element and the second electronic element do not overlap in a plane direction,
the first connection body has a first head part including a first head area on lower side of the first connection body where the first electronic element is provided, a second head area on upper side of the first connection body where the second electronic element is provided, and a bent part provided between the first head area and the second head area in the plane direction, and
(1) the first connection body has a plurality of first support parts extending from the first head part and abutting on the first substrate, at least one of the first support parts functions electrically and at least one of the first support parts does not function electrically, or (2) the second connection body has a second head part and a plurality of second support parts extending from the second head part and abutting on the first substrate,
at least one of the second support parts functions electrically- and at least one of the second support parts does not function electrically.

6. An electronic module comprising:
a first substrate which is a ceramic substrate, an insulating resin layer or a metal substrate;
a first electronic element provided on upper side of the first substrate;
a first connection body provided on upper side of the first electronic element;
a second electronic element provided on upper ene side of the first connection body; and
a second connection body provided on upper side of the second electronic element, wherein
the first electronic element and the second electronic element do not overlap in a plane direction,
the first connection body has a first head part including a first head area on lower side of the first connection body where which the first electronic element is provided, a second head area on upper side of the first connection body where the second electronic element is provided, and a bent part provided between the first head area and the second head area in the plane direction,
the first connection body has a plurality of first pillar parts extending from the first head part to lower side, and a plurality of first support parts extending from the first head part,
the second connection body has a second head part, a second pillar part extending from the second head part to lower side, and a plurality of second support parts extending from the second head part to lower side,
the second electronic element, one of the first pillar parts and the second pillar part overlap in the plane direction, and at least another one of the first pillar parts and the second pillar part do not overlap in the plane direction,
at least one of the first support parts functions electrically, and at least one of the first support parts does not function electrically, and
at least one of the second support parts functions electrically, and at least one of the second support parts does not function electrically.

* * * * *